United States Patent
Yamabe (12)

(10) Patent No.: US 6,198,699 B1
(45) Date of Patent: Mar. 6, 2001

(54) SEMICONDUCTOR TESTING APPARATUS

(75) Inventor: Morihiro Yamabe, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/102,066

(22) Filed: Jun. 22, 1998

(30) Foreign Application Priority Data

Jun. 27, 1997 (JP) .................................................. 9-172502

(51) Int. Cl.[7] .............................. G04F 8/00; G04F 10/00; G04F 31/28
(52) U.S. Cl. .......................... 368/113; 324/73.1; 714/736; 714/738
(58) Field of Search ..................... 368/107–113; 324/73.1; 364/569, 575, 580; 371/27; 714/736, 738

(56) References Cited

U.S. PATENT DOCUMENTS 4,646,299 * 2/1987 Schinabeck et al. ................... 371/27
5,696,772 * 12/1997 Lesmeister ............................. 371/27

* cited by examiner

Primary Examiner—Vit Miska
(74) Attorney, Agent, or Firm—Fish & Richardson P.C.

(57) ABSTRACT

An IC testing apparatus which is able to measure the execution time of an automatic function for each DUT by a one-time test, and to grade said automatic function automatically based on the above measured execution time. A IC testing apparatus comprises a evaluation circuit of the automatic function with minimum execution time, a timer which is activated by the above evaluation circuit, and a timer counter which is activated by the above timer and stopped by the evaluation of each DUT, and automatically measures the execution time of automatic function of each DUT.

6 Claims, 1 Drawing Sheet

SEMICONDUCTOR TESTING APPARATUS

BACKGROUND OF THE INVENTION

1. Field of the Invention

The present invention relates to an IC (Integrated Circuit) testing apparatus which is used to measure the execution time of self a function which is executed automatically and independently by IC chip to be tested.

This application is based on patent application No. Hei 09-172502 filed in Japan, the content of which is incorporated herein by reference.

2. Description of Related Art

A memory IC with an automatic function is increasing in popularity, in particular, flash memory ICs with an automatic program function or an automatic erase function. These automatic functions generally take a long time to execute, (as long as 30 seconds, for example), and the execution time for each IC is different.

The test for the automatic function mentioned above also takes a long time and, at the same time, increases the cost for the test. Also, the user sometimes must select the ICs depending on the execution time of the automatic function, in order to avoid the long testing time.

There is a problem in that the conventional IC testing apparatus cannot measure the execution time of the automatic function, even though some testing apparatuses can stop the test halfway when all the DUTS (Device Under Test) which are simultaneously tested have passed the test before the predefined maximum testing time. The stop halfway is possible because of providing an evaluation circuit for the automatic function with minimum execution time, which has a different time for each DUT.

Device selection based on the execution time of the automatic function requires a very long time to calculate the time to the transition point using a judging result for every cycle which is stored in the memory. A conventional IC testing apparatus cannot make an automatic device selection based on the execution time of an automatic function because a circuit which measures the execution time of an automatic function of the DUT is not provided.

SUMMARY OF THE INVENTION

It is therefore an object of the present invention to provide an IC testing apparatus which is capable of measuring an execution time of an automatic function for each DUT by a one-time test, and to make a grading of each DUT based on above measurement.

In order to attain this object, the present invention provides an IC testing apparatus for a burn-in check comprising an evaluation circuit of the automatic function with minimum execution time; a timer activated by the evaluation circuit of the automatic function with minimum execution time; a timer counter activated by the timer, and stopped by each result of the IC to be tested; and is further capable of measuring the execution time of the automatic function of each IC to be tested.

The present invention further provides an IC testing apparatus according to the above, which is further capable of selecting an IC by the execution time of the automatic function of each IC with minimum selection time, wherein each of said evaluating results of the IC to be tested is sent to the timer counter via an output pin selector for the automatic function, and said timer counter is used for automatic measuring of the execution time of an automatic function of each IC by being realized with a minimum circuit.

With the IC testing apparatus of the present invention, the execution time of the automatic function for each DUT can be measured by a one-time test, and automatic grading of the DUT is also possible based on the measured execution time of the automatic function.

DESCRIPTION OF PREFERRED EMBODIMENT

Figure 1:
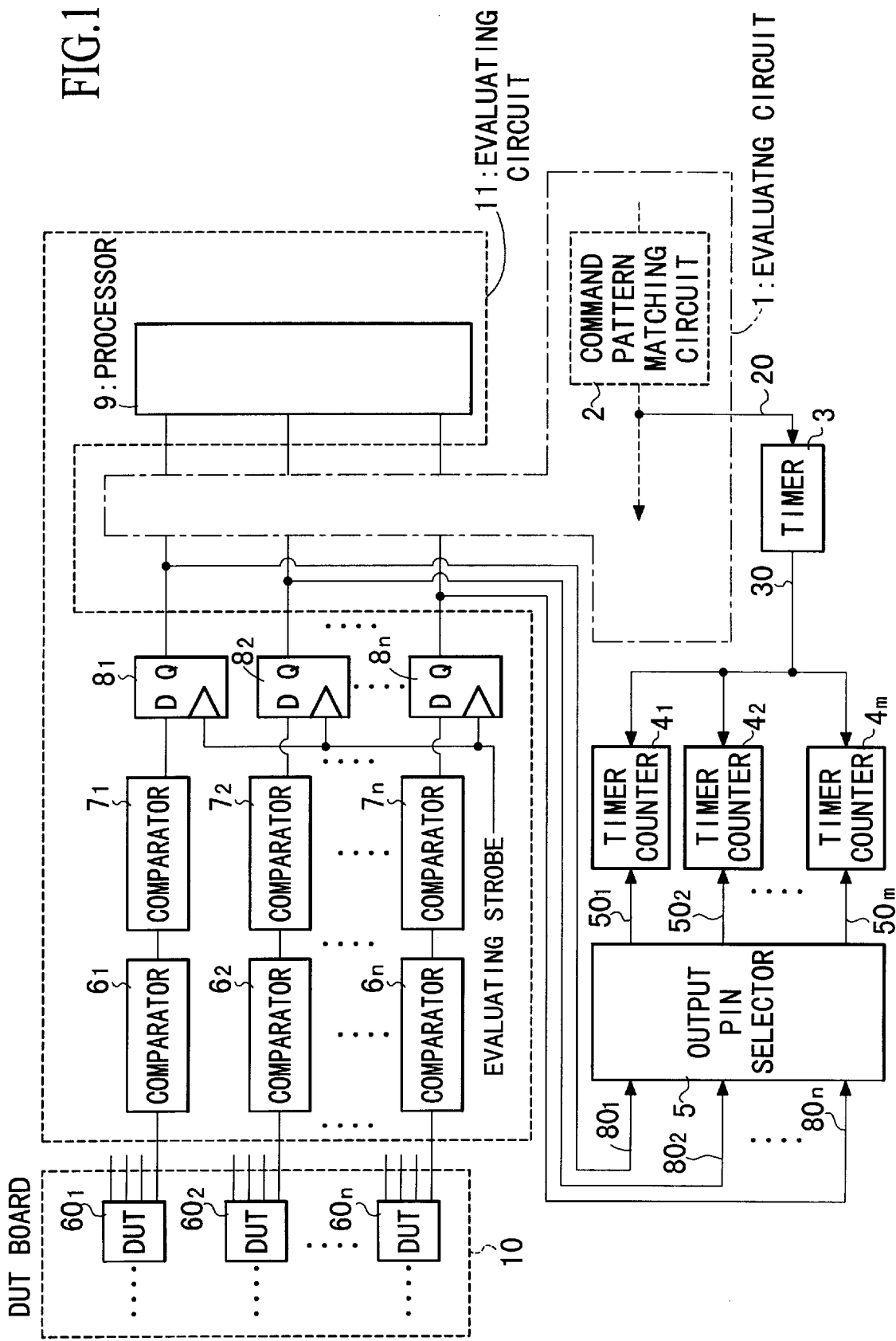
FIG. 1 is a diagram illustrating the IC testing apparatus according to an embodiment of the present invention.

Hereinbelow, an IC testing apparatus according to an embodiment of the present invention will be described with reference to FIG. 1 which is a diagram illustrating the IC testing apparatus according to an embodiment of the present invention. In FIG. 1, a command pattern matching circuit 2 is contained in a evaluation circuit 1 of the automatic function with minimum execution time. A timer 3 is activated by the command pattern matching circuit 2. An output pin selector 5 for an automatic function selects the judging signals $50_1, 50_2, \ldots, 50_m$ of the output pin for the automatic function from real-time judging signals $80_1, 80_2, \ldots, 80_m$ for all I/O (Input/Output) pins. Timer counters $4_1, 4_2, \ldots, 4_m$ are activated by the timer 3, and are stopped by the output pin selector 5 for the automatic function. DUT $60_1, 60_2, \ldots, 60_n$ are mounted on a DUT board 10.

Comparators $6_1, 6_2, \ldots, 6_n$ are analog circuit comparators with general construction, and belong to an evaluation circuit 11 of the semiconductor testing apparatus. They compare the output signals from the DUT with $V_{OH}$(high voltage) and $V_{OL}$(low voltage), the voltages of which are predefined by programming.

Comparators $7_1, 7_2, \ldots, 7_n$ are also realized with general logic construction, and they compare the output signal from the DUT with an expected value.

F/F(Flip/Flop) $8_1, 8_2, \ldots, 8_n$ for real time measurement are D(Data)type F/F, and are a part of an evaluation circuit 11 of an IC testing apparatus which is in general use. They latch the output of the comparators $7_1, 7_2, \ldots, 7_n$ with a judging strobe whose timing is predefined by program, in order to judge whether the output timing from the DUT is correct in the cycle time.

A processor 9 for judgement result is also one in general use, a part of an evaluation circuit 11 of an IC. It stores the result after testing when a failure state (i.e., the case of the output of the DUT not being the same as an expected value) occurs in a cycle.

Next, an explanation of the operation of an embodiment of the present invention is as follows. First, the execution command of the automatic function which is read out at the pattern program sequence control circuit of the IC testing apparatus is fed to a command pattern matching circuit 2 contained in the evaluation circuit of the automatic function with minimum execution time 1.

The command pattern matching circuit 2 recognizes the execution command, and outputs the trigger signal 20 to the timer 3 corresponding to each execution command. The timer 3 receives the trigger signal 20, starts to measure the time by counting down using the reference clock, with a time interval arbitrarily pre-set via a CPU bus, such as the minimum execution time of automatic function, and outputs the start trigger signal 30 to the timer counters $4_1, 4_2, \ldots, 4_m$ after the above time is up.

The output pin selector 5 for automatic function selects the evaluation signals $50_1$–$50_n$ of output pin for automatic function from real time evaluation signals $80_1$–$80_m$ for all I/O pins, and outputs them to the timer counters $4_1$, $4_2$, . . . , $4_m$.

The timer counters $4_1$, $4_2$, . . . $4_m$ counts up with a reference clock of a specific frequency, and the number of the timer counters $4_1$, $4_2$, . . . ,$4_4$. correspond to the maximum number of DUTs simultaneously tested. All the timer counters start counting up by the start trigger signal from timer 3.

The operations of each timer counter $4_1$, $4_2$, . . . $4_m$, are individually stopped by the evaluation signal, usually a transient signal from failure to pass evaluation, for each DUT from output pin selector 5 for automatic function. The stop is performed, for example, by adding a logic gate at the input of the reference clock to the counter.

After the test is finished, the execution time of the automatic function for each DUT is obtained by reading data of each timer counter 4 via CPU bus and by automatic multiplication of the data with the reference clock cycle time. The multiplication is performed in the CPU.

What is claimed is:

1. A testing apparatus for integrated circuits comprising:
   an evaluation circuit for an automatic function contained in the integrated circuits;
   a timer activated by the evaluation circuit for the automatic function;
   a respective timer counter, for each integrated circuit, activated by the timer, and stopped by an evaluation result of a corresponding one of the integrated circuits; and
   wherein the integrated circuit testing apparatus is capable of measuring an execution time of the automatic function of each integrated circuit using the result of that integrated circuit's corresponding timer counter.

2. The testing apparatus according to claim 1, wherein said testing apparatus is used for a burn-in test of integrated circuits.

3. The testing apparatus according to claim 1, wherein the testing apparatus is used for testing memory integrated circuits.

4. The testing apparatus according to claim 1 which is further capable of selecting one of the integrated circuits based on the execution times of the automatic function of the integrated circuits, wherein:
   the evaluation result of each integrated circuit is sent to the respective timer counter via an output pin selector for the automatic function; and the respective timer counter is used for automatically measuring the execution time of the automatic function of the integrated circuit.

5. The testing apparatus according to claim 4, wherein the testing apparatus is used for testing memory integrated circuits.

6. The testing apparatus according to claim 1 including a processor that calculates the execution time of the automatic function of each integrated circuit based on data obtained from the respective timer counter.

* * * * *